United States Patent
Kemper et al.

(10) Patent No.: US 6,937,316 B2
(45) Date of Patent: Aug. 30, 2005

(54) LITHOGRAPHIC APPARATUS, DEVICE MANUFACTURING METHOD AND DEVICE MANUFACTURED THEREBY

(75) Inventors: Nicolaas Rudolf Kemper, Eindhoven (NL); Hernes Jacobs, Eindhoven (NL); Edwin Johan Buis, Belfeld (NL)

(73) Assignee: ASML Netherlands B.V., Veldhoven (NL)

( * ) Notice: Subject to any disclaimer, the term of this patent is extended or adjusted under 35 U.S.C. 154(b) by 75 days.

(21) Appl. No.: 10/217,332

(22) Filed: Aug. 13, 2002

(65) Prior Publication Data

US 2003/0048428 A1 Mar. 13, 2003

(30) Foreign Application Priority Data

Aug. 15, 2001 (EP) .............................. 01306943

(51) Int. Cl.⁷ ..................... G03B 24/42; G03B 27/52; G03B 27/58
(52) U.S. Cl. .............. 355/30; 355/53; 355/72
(58) Field of Search ................ 355/30, 53, 72; 285/227; 138/121

(56) References Cited

U.S. PATENT DOCUMENTS

| | | | | |
|---|---|---|---|---|
| 3,318,335 A | * | 5/1967 | Heller | 138/121 |
| 4,125,130 A | * | 11/1978 | Yamamoto | 138/121 |
| 5,050,894 A | | 9/1991 | Merel et al. | 277/182 |
| 5,397,157 A | * | 3/1995 | Hempel et al. | 285/227 |
| 6,315,332 B1 | * | 11/2001 | Aschoff et al. | 285/227 |
| 6,714,277 B2 | * | 3/2004 | Hara et al. | 355/30 |
| 6,727,981 B2 | * | 4/2004 | Taniuchi et al. | 355/55 |
| 6,784,972 B2 | * | 8/2004 | Nagahashi et al. | 355/30 |
| 2001/0028443 A1 | * | 10/2001 | Yabu | 355/30 |
| 2002/0159042 A1 | * | 10/2002 | Poon | 355/53 |

FOREIGN PATENT DOCUMENTS

| | | |
|---|---|---|
| DE | 8200937.6 | 9/1982 |
| DE | 29823586 | 12/1999 |
| EP | 0627667 A1 | 12/1994 |
| JP | 57076362 | 5/1982 |
| JP | 04151088 | 10/1990 |
| JP | 04157399 | 5/1992 |

* cited by examiner

*Primary Examiner*—Rodney Fuller
(74) *Attorney, Agent, or Firm*—Pillsbury Winthrop Shaw Pittman LLP (57) ABSTRACT

A bellows used to connect two sealed compartments of the lithographic apparatus or a compartment and a pump, comprises a first section having smooth helical corrugations and a second section that can accommodate the longitudinal movement caused by relative rotation of the ends of the first section. The second section may be a mirror image of the first section or one or more sub-sections of circumferential corrugations.

15 Claims, 5 Drawing Sheets

LITHOGRAPHIC APPARATUS, DEVICE MANUFACTURING METHOD AND DEVICE MANUFACTURED THEREBY

RELATED APPLICATION

This application claims the benefit of priority to European Parent Application No. 01306943.0, filed Aug. 15, 2001, the entire contents of which are herein incorporated by reference.

BACKGROUND OF THE INVENTION

1. Field of the Invention

The present invention relates to a lithographic projection apparatus.

2. Description of the Related Art

The term "patterning device" as here employed should be broadly interpreted as referring to device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of such a patterning device is a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support will generally be a mask table, which ensures that the mask can be held at a desired position in the incoming radiation beam, and that it can be moved relative to the beam if so desired.

Another example of a pattering device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam an a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from United States Patents U.S. Pat. Nos. 5,296,891 and 5,523,193, and PCT publications WO 98/38597 and WO 98/33096. In the case of a programmable mirror array, the support may be embodied as a frame or table, for example, which may be fixed or movable as required.

Another example of a patterning device is a programmable LCD array. An example of such a construction is given in U.S. Pat. No. 5,229,872. As above, the support structure in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally<1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and caradioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are described, for example, in U.S. Pat. Nos. 5,969,441 and 6,262,796.

In order to image ever smaller features, it is necessary to use ever shorter wavelengths in the projection beam; existing apparatus use ultraviolet (UV) or deep ultraviolet (DUV) to 193 nm while it is proposed to use DUV radiation at 157 or 126 nm or extreme ultraviolet radiation (EUV) in the range of 5 to 20 nm. Also proposed are apparatus using charged particle beams, especially electron beams. All of these proposed radiation types are heavily absorbed by air so that apparatus using 157 or 126 nm radiation must be flushed with a purge gas such as nitrogen while apparatus using EUV and charged particle beams must be evacuated to exacting standards. Such apparatus must therefore be enclosed in gas- or vacuum-tight compartments.

It is convenient to enclose different parts of the apparatus, e.g. the radiation source illumination system and projection system, in separate compartments. Then it is necessary to provide gas- or vacuum-tight connections between the compartments that will pass the beam of radiation, which can have quite a large diameter. It is also necessary to connect the different compartments to vacuum pumps or purge gas supply and exhaust systems.

In all lithographic apparatus, it is important to isolate at least the mask, substrate and projection lens from vibration, and this requirement only increases as the size of the features to be imaged reduces. It is further important to isolate different compartments from stresses, forces and moments resulting from relative movements caused by, e.g., thermal expansion, vibrations and mounting tolerances. It is therefore desirable to mechanically isolate different compartments of the apparatus from each other and particularly to isolate devices such as pumps which are a significant source of vibrations.

It is therefore known to use metal bellows for connections between compartments of an evacuated or purged lithographic apparatus and to vacuum conduits leading to pumps. Such bellows take various forms but are generally cylindrical or conical with corrugations perpendicular to the axis of the bellows. By making the corrugations sufficiently large and the wall of the bellows sufficiently thin, the stiffness of the bellows relative to longitudinal and lateral movements of its ends and to angular movements about axes perpendicular to the axis of the cylinder or cone can be made low. A low stiffness prevents the transmission of vibrations through the bellows. However, known bellows are stiff to rotational movements about the axis of the cylinder or cone, particularly where the diameter of the bellows is large to accommodate the beam of radiation or a large flow of air or purge gas. Known bellows therefore remain a transmission path of undesirable torsional vibrations, forces and moments.

SUMMARY OF THE INVENTION

It is an aspect of the present invention to provide a bellows for use in a lithographic apparatus that is capable of isolating torsional vibrations, forces and/or moments.

This and other aspects are achieved according to the invention in a lithographic apparatus including a radiation system constructed and arranged to provide a beam of radiation; a support constructed and arranged to support a patterning device, the patterning device constructed and arranged to pattern the beam of radiation according to a desired pattern; a substrate table that holds a substrate; and a projection system constructed and arranged to project the patterned beam onto a target portion of the substrate; wherein at least part of at least one of the radiation system, the support structure, the substrate table and the projection system is accommodated in a sealed chamber and a bellows is provided to provide a closed passage between the sealed chamber and another chamber or a pump, the passage having a longitudinal axis; wherein the bellows comprises: a first section having a plurality of corrugations extending helically about the longitudinal axis such that opposite ends of the first section may be rotated relative to each other; and a second section adapted to be changeable in length to compensate for changes in length of the first section.

The helical corrugations in the first section allow it to accommodate a relative rotation of its ends though such a rotation will cause a change in length of the first section. Accordingly, the second section is provided to accommodate that change and maintain the overall length of the bellows constant. The first section couples changes in length to rotations but the second section de-couples them. Within certain ranges, the ends of the bellows may translate and rotate in a total of six degrees of freedom independently of each other. The bellows can have a low stiffness in each of these degrees of freedom, preventing vibrations from being transmitted across the bellows.

The smooth corrugations in the bellows distribute the torsional stress resulting from the corrugations evenly throughout the bellows. Rather than focusing the stress at a single point this decreases overall wear of the bellows and a leak in the bellows is therefore less likely. For high precision applications, especially those using EUV radiation loss of gas is a major problem. Before use the apparatus must be thoroughly cleaned and smooth corrugations are easier to clean than folds and can be cleaned more effectively.

The corrugations should therefore preferably have a large radius of curvature compared to the thickness of the bellows material, e.g., at least five times larger. The corrugations can be sinusoidal and the peaks and troughs preferably run parallel to one another.

The second section may be a section of helical corrugation corresponding to those of the first section but wound in the opposite sense or a section of circumferential corrugations.

The first section at least should have a basic form that is rotationally symmetric.

According to a further aspect of the invention there is provided a device manufacturing method including providing a beam of radiation using a radiation system; using a patterning device to endow the projection beam with a pattern in its cross-section; projecting the patterned beam of radiation onto a target portion of the layer of radiation-sensitive material; and providing a bellows to communicate between a sealed compartment enclosing at least a part of one of the radiation system, a support configured to support the patterning device, the substrate table and the projection system, another compartment, and a pump, the bellows having a first section having helical corrugations and a second section adapted to accommodate changes in length of the first section.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. One of ordinary skill will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

Figure 1:
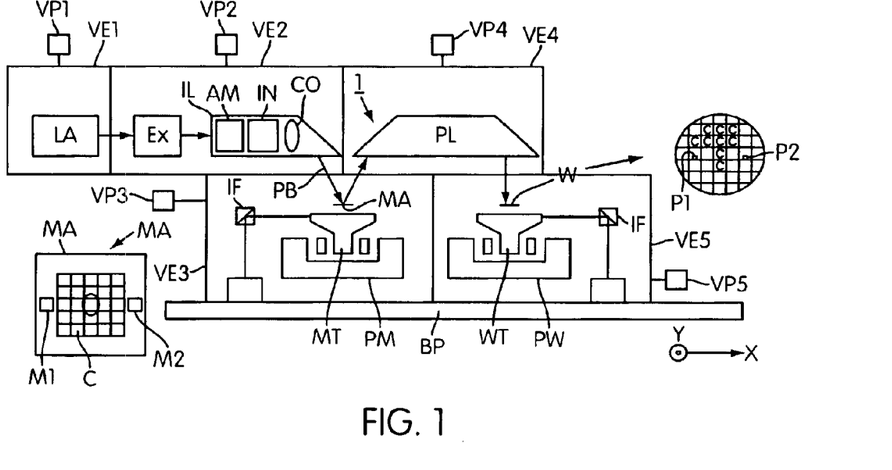
FIG. 1 depicts a lithographic projection apparatus according to an embodiment of the invention.

FIG. 1 schematically depicts a lithographic projection apparatus 1 according to an embodiment of the invention. The apparatus includes a base plate BP; a radiation system Ex, IL constructed and arranged to supply a beam PB of radiation (e.g. EUV radiation), which in this particular case also comprises a radiation source LA; a first object table (mask table) MT provided with a mask holder that holds a mask MA (e.g. a reticle), and connected to a first positioning device PM that accurately positions the mask with respect to a projection system PL; a second object table (substrate table) WT provided with a substrate holder that holds a substrate W (e.g. a resist-coated silicon wafer), and connected to a second positioning device PW that accurately positions the substrate with respect to the projection system PL; the projection system ("lens") PL (e.g. a mirror group) constructed and arranged to image an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example (with a transmissive mask). Alternatively, the apparatus may employ another kind of patterning device, such as a programmable mirror array of a type as referred to above.

The source LA (e.g. a discharge or laser-produced plasma source) produces radiation. This radiation is fed into an illumination system (illuminator) IL, either directly or after having traversed a conditioning device, such as a beam expander Ex, for example. The illuminator IL may comprise an adjusting device AM that sets the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors). This latter scenario is often the case when the source LA is an excimer laser. The present invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning device PW and interferometer IF, the substrate table WT can be moved accurately, e.g., so as to position different target portions C in the path of the beam PB. Similarly, the first positioning device PM can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks $M_1$, $M_2$ and substrate alignment marks $P_1$, $P_2$.

The depicted apparatus can be used in two different modes:

1. In step mode, the mask table MT is kept essentially stationary, and an entire mask image is projected at once, i.e. a single "flash" onto a target portion C. The substrate table WT is then shifted in the X and/or Y directions so that a different target portion C can be irradiated by the beam PB;

2. In scan mode, essentially the same scenario applies, except that a given target portion C is not exposed in a single "flash". Instead, the mask table MT is movable in a given direction (the so-called "scan direction", e.g., the Y direction) with a speed v, so that the beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Although not depicted in FIG. 1, the beam path of the apparatus is evacuated to a very deep vacuum—the total pressure must be as low as $10^{-6}$ millibar with partial pressures of hydrocarbons $10^{-8}$ or $10^{-9}$ millibar. The strictness of this requirement is to prevent contamination of mirrors, the mask and the wafer. To enable this vacuum level to be reached and maintained, the various sections of the apparatus, e.g. the radiation source LA, illumination system IL, the mask stage, the projection system PL and substrate stage, are kept in separate vacuum enclosures VE1, VE2, VE3, VE4, VE5, respectively, which are connected to vacuum pumps VP1, VP2, VP3, VP4, VP5, respectively, of appropriate type and capacity.

To connect together the various compartments and their pumps while allowing the passage of the beam, measurement beams or gas flow, yet preventing the transmission of vibrations, forces and moments to and between the compartments, isolation bellows are used. In order to prevent the transmission of vibrations, forces and moments in the torsional ($R_Z$), longitudinal (Z) and lateral (X,Y) and angular ($R_x$, $R_y$) directions relative to the axis of die bellows, die isolation bellows used in the invention incorporate at least one section having helical corrugations and a least one section accommodating longitudinal movements.

In the following description, reference will be made to an XYZ orthogonal coordinate system where the Z axis is the longitudinal axis of the unstressed bellows and one end of the bellows lies in the XY plane. In such a coordinate system, torsional movements may be referred to as $R_Z$. It should be noted that the use of this coordinate system is for convenience of description only and should not be taken as implying any specific orientation of the bellows relative to the earth or to any other coordinate system defined in the apparatus. Further, the reference to a longitudinal axis of the bellows should not be taken as requiring that the bellows be cylindrical or have a straight longitudinal axis.

Figure 2:
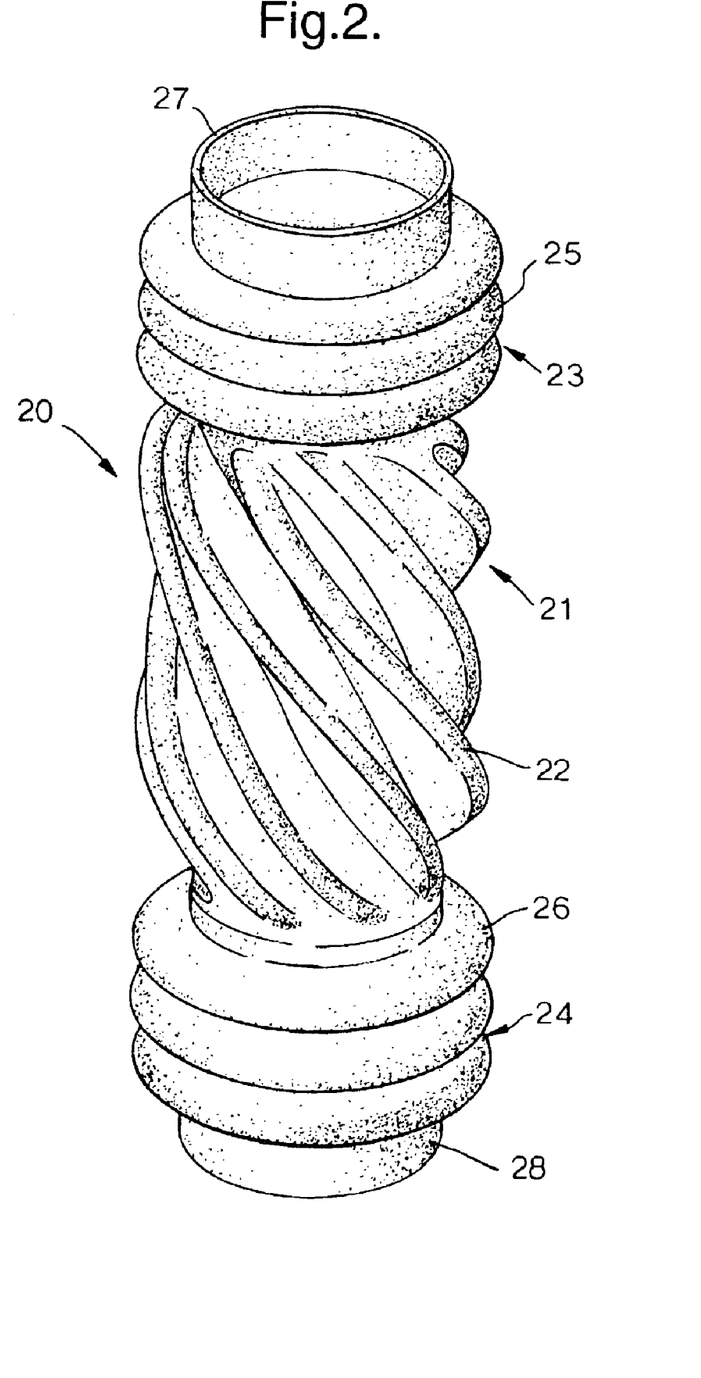
FIGS. 2 to 6 are perspective views of bellows useable in embodiments of the invention.

A first example of an isolation bellows 20 useable in the invention is shown in FIG. 2. Isolation bellows 20 is generally cylindrical in shape and comprises three movement accommodating sections: a central section 21 having smooth helical corrugations 22 and outer sections 23, 24 having circumferential corrugations 25, 26. Plain cylindrical end portions 27, 28 are provided to facilitate mounting the bellows to a compartment or vacuum conduit. There are eight corrugations, each extending for substantially half a turn about the longitudinal axis of the bellows. The bellows 20 is used to form a closed passage from one vacuum chamber to another and, in this example, the longitudinal axis of the bellows corresponds to the longitudinal axis of the passage.

The helical corrugations 22 are disposed at an angle of between 30° and 60°, preferably 45°, to the longitudinal axis of the bellows 20. If a torsional ($R_Z$) force is applied between the ends 27, 28, the helical corrugations 22 of the central section 21 will allow a relative rotational movement of the outer sections 23, 24 but in doing so will change in length in the longitudinal (Z) direction. This change in length is however accommodated by the circumferential corrugations 25, 26 of the outer sections 23, 24 so that there is no longitudinal movement of the ends 23, 24. In essence, while the helical corrugations 22 couple Z and $R_Z$ movements, the outer sections de-couple these movements by accommodating Z movements.

Figure 3:
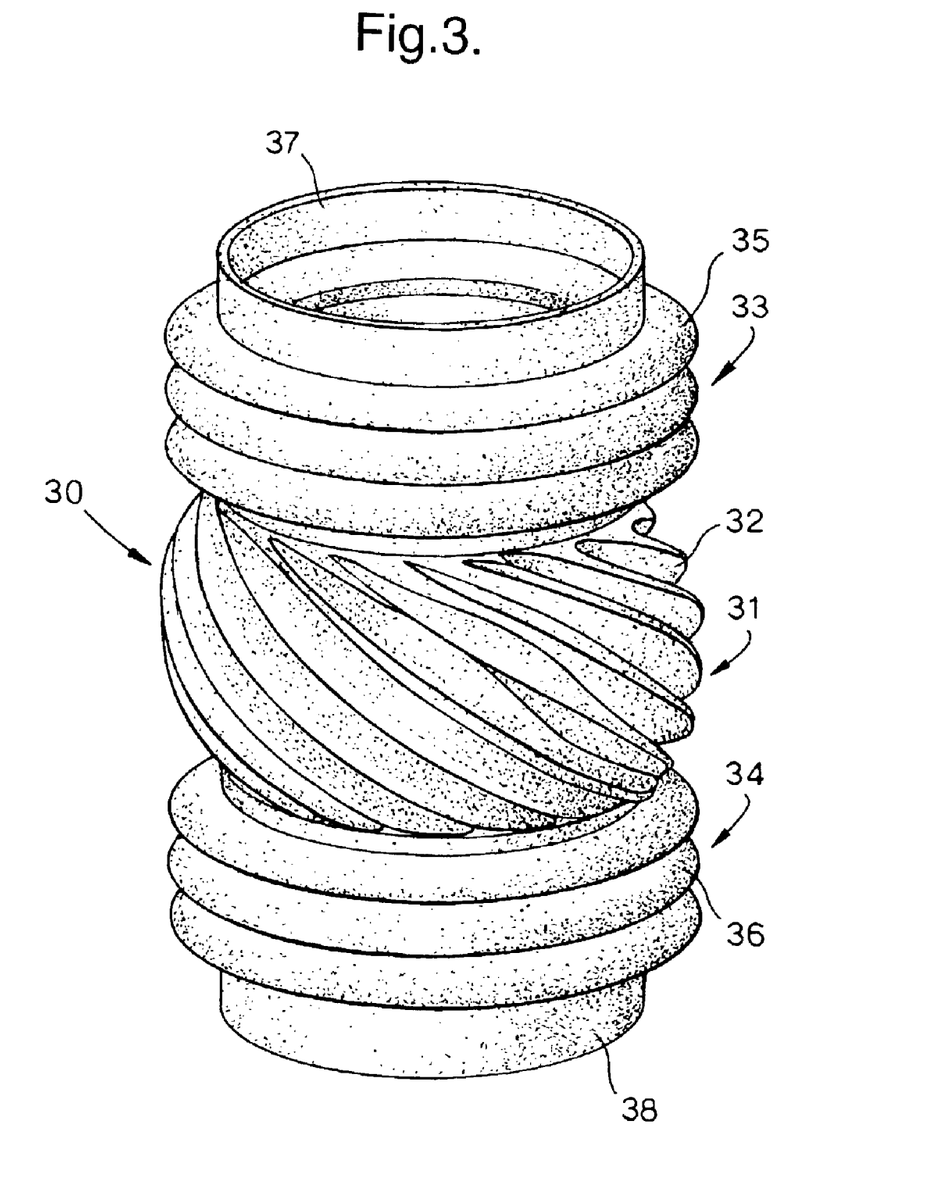

It will be appreciated that the dimensions of the bellows and the sizes and numbers of the various corrugations may be varied according to the size of the vacuum path desired and the range of movements that must be accommodated. This is shown by FIG. 3 which depicts a second example of an isolation bellows 30 useable in the invention. This bellows is functionally the same as bellows 20 but has a larger radius compared to its length. Parts in bellows 30 perform the same function as parts in bellows 20 with a reference numeral of 10 less. Bellows 30 has fifteen corrugations, each extending substantially half a turn about the longitudinal axis.

Figure 4:
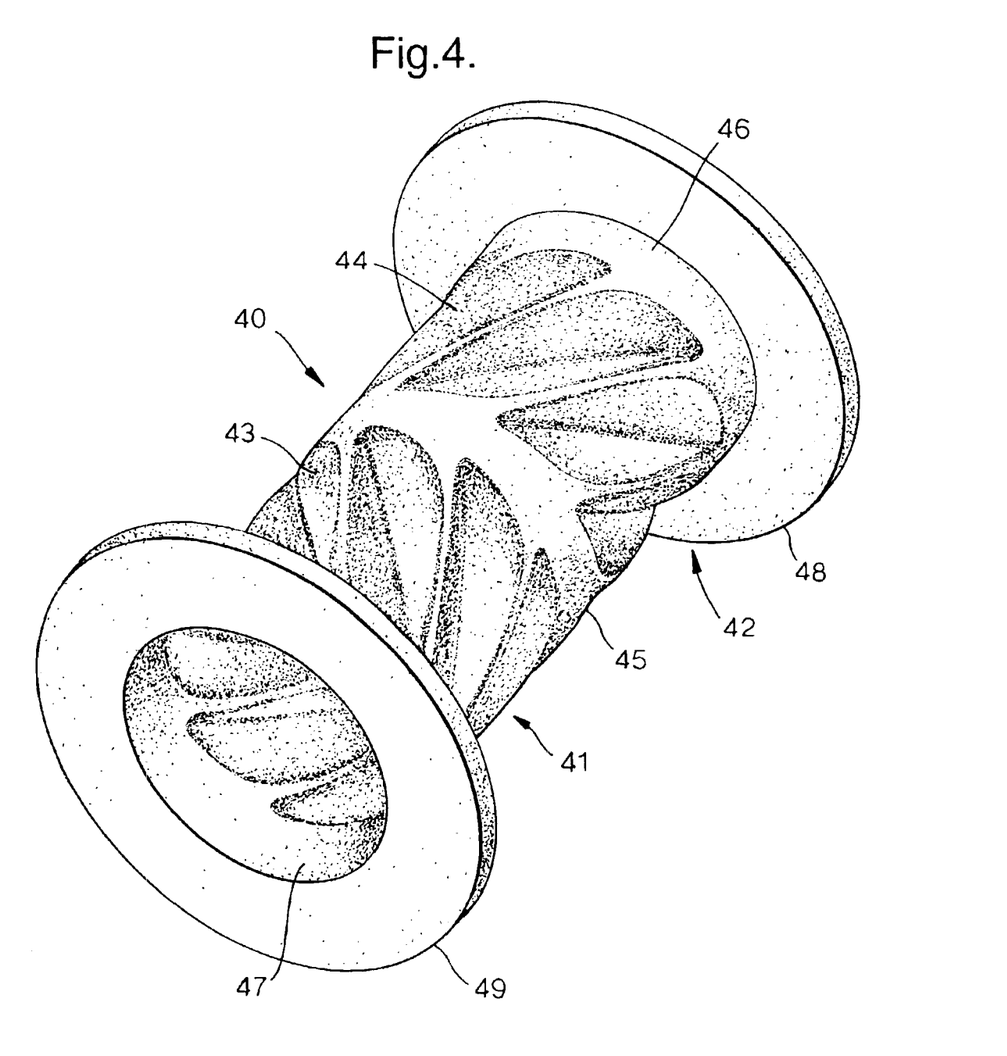

A third example of an isolation bellows 40 according to the invention is shown in FIG. 4. In bellows 40, two helical sections 41, 42, each having eight helical corrugations 43, 44 extending substantially a quarter turn, are provided. The helical corrugations 43, 44 of the two helical sections 41, 42 turn in opposite senses, one clockwise and the other counter-clockwise. In this way, one of the helical sections acts to accommodate longitudinal movements of the other. This can be explained by reference to the example of a clockwise torque applied to mounting flange 49, with mounting flange 48 fixed. Under the influence of such a force, helical section 43 will "wind up" and contract longitudinally while helical section 42 will "unwind" and extend longitudinally. If the two helical sections are constructed identically, but in mirror image, the overall length of bellows 40 will remain constant.

In bellows 40, cylindrical portions 45, 46, 47 are provided for convenience. It should also be noted that bellows 40 will accommodate a relative Z displacement of the two ends by rotation of the middle portion 45 relative to the ends. For example, a compression of the bellows will cause the two helical portions to wind up and both will cause the middle section to rotate counter-clockwise. Of course combinations of both torsional and longitudinal movements can be accommodated.

In bellows 40, cylindrical portions 45, 46, 47 are provided for convenience in manufacture and to allow the overall length of the bellows to be set as desired. It will also be seen that the helical corrugations 43, 44 are formed as insets into a nominal cylindrical surface, and are relatively sharply cornered.

Figure 5:
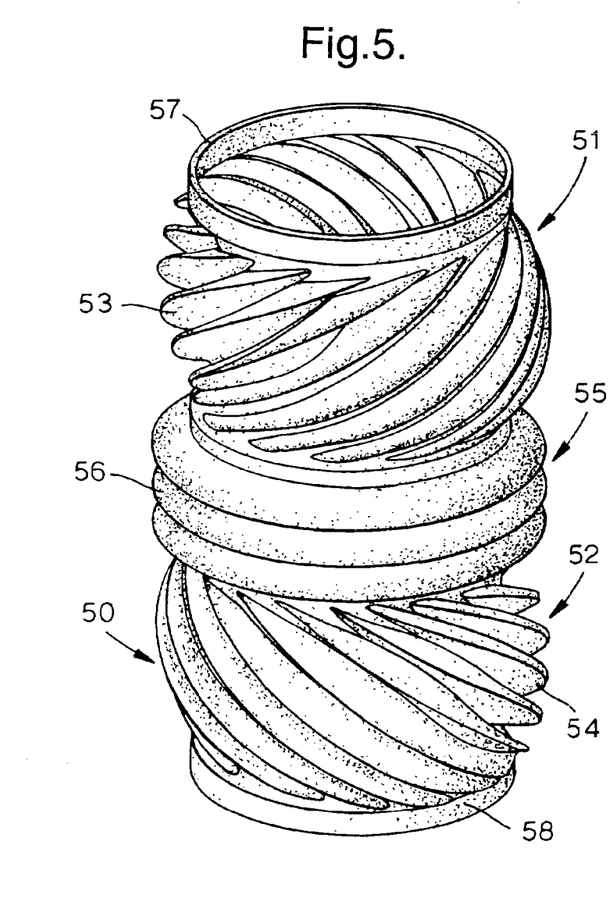

FIG. 5 shows a fourth example of an isolation bellows 50 useable in the present invention. This example has two helical sections 51, 52 with oppositely turning helical corrugations 53, 54, fifteen in each section extending substantially a half turn, and a middle section 55 of circumferential corrugations 56. The oppositely "wound" helical sections 51, 52 function as in the third example while the middle section 55 provides additional capacity to accommodate longitudinal (Z), lateral (X & Y) and angular ($R_X$, $R_Y$) movements. The middle section 55 also reduces the stiffness to torsional ($R_Z$) movements by accommodating some longitudinal movement on rotation of one end 57 or 58.

Figure 6:
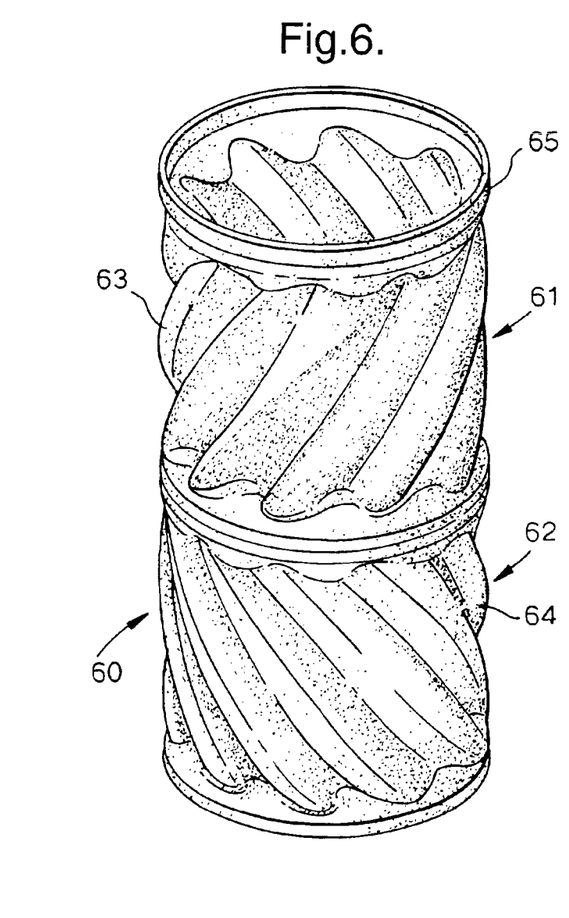

A fifth example of an isolation bellows 60 useable in the invention is shown in FIG. 6. This is similar to the third example (FIG. 4) in having oppositely "wound" helical sections 61, 62 but has more rounded corrugations 63, 64, eight in number and extending substantially a half turn. Also, cylindrical end sections 65, 66 for mounting are provided.

As can be seen in FIGS. 2 to 6 the corrugations are smooth and have a large radius of curvature compared to the thickness of the bellows material. In each of these examples the peaks and troughs of the corrugations run parallel to each other and form the same angle to the longitudinal axis of the bellows.

It should be noted that while examples of the isolation bellows having a generally cylindrical form have been described, the bellows may take other forms. For example, the basic form of the bellows (i.e., the shape onto which the corrugations are superimposed) may have a cross-section in the form of an oval, square, or other polygon. In general the basic form of the bellows may be a prism, meaning a shape whose ends are similar, equal and parallel polygons and sides are parallelograms, a prismoid, meaning a shape whose ends are similar but unequal polygons, or conical, with a cylinder being a limiting example of a core. Also, the functional sections of the bellows may be adjacent or separated by sections, which need not have low stiffness, of any convenient form. Terminating portions, again of any convenient form may be provided at either or both ends.

All of the isolation bellows described above must be formed of an elastic material, such as a metal. A presently preferred method of manufacturing these devices is electroforming. In such a method, a form of appropriate shape is made and then covered in a metal layer of appropriate thickness by an electroplating technique. The form is then removed, e.g. by dissolving, melting or mechanically, to leave the metal layer freestanding.

While specific embodiments of the invention have been described above, it will be appreciated that the invention may be practiced otherwise than as described. The description is not intended to limit the invention.

We claim:

1. A lithographic projection apparatus, comprising:

a radiation system constructed and arranged to provide a beam of radiation;

a support constructed and arranged to support a patterning device, the patterning device constructed and arranged to pattern the beam according to a desired pattern;

a substrate table that holds a substrate;

a projection system constructed and arranged to project the patterned beam onto a target portion of the substrate;

wherein at least part of at least one of the radiation system, the support, the substrate table and the projection system is accommodated in a sealed chamber and a bellows is provided to provide a closed passage between the sealed chamber and another chamber or a pump, the passage having a longitudinal axis, wherein the bellows comprises:

a first section having a plurality of smooth corrugations extending helically about the longitudinal axis such that opposite ends of the first section may be rotated relative to each other; and a second section adapted to be changeable in length to compensate for changes in length of the first section, wherein a radius of curvature of the smooth corrugations is larger than a thickness of the bellows material.

2. An apparatus according to claim 1, wherein the second section has a plurality of smooth corrugations extending helically about the longitudinal axis in an opposite sense to the smooth corrugations of the first section.

3. An apparatus according to claim 2, wherein the second section is substantially a mirror image of the first section.

4. An apparatus according to claim 1, wherein the second section has a plurality of smooth corrugations extending perpendicular to the longitudinal axis.

5. An apparatus according to claim 1, the bellows further comprising a third section having a plurality of smooth corrugations extending perpendicular to the longitudinal axis.

6. An apparatus according to claim 1 wherein peaks and troughs of the smooth corrugations are parallel.

7. An apparatus according to claim 1, wherein peaks and troughs of the smooth corrugations make the same angle to the longitudinal axis of the bellows.

8. An apparatus according to claim 1, wherein the smooth corrugations are sinusoidal.

9. An apparatus according to claim 1, wherein the first section has between four and thirty smooth corrugations.

10. An apparatus according to claim 1, wherein the smooth corrugations of the first section extend for between one quarter of a turn and one turn about the longitudinal axis.

11. An apparatus according to claim 1, wherein at least one of the first section and the second section has a cross-section perpendicular to the longitudinal axis that is generally circular.

12. An apparatus according to claim 1, wherein the support comprises a mask table for holding a mask.

13. An apparatus according to claim 1, wherein the radiation system comprises a radiation source.

14. A device manufacturing method, comprising:

providing a beam of radiation using a radiation system;

using a pattering device to endow the projection beam with a pattern in its cross-section;

projecting the patterned beam of radiation onto a target portion of the layer of radiation-sensitive material; and providing a bellows to communicate between a sealed compartment enclosing at least a part of one of the radiation system, a support configured to support the patterning device, the substrate table and the projection system, another compartment, and a pump, the bellows having a first section having smooth helical corrugations and a second section adapted to accommodate changes in length of the first section, wherein a radius of curvature of the smooth corrugations is larger than a thickness of the bellows material.

15. A device manufactured according to the method of claim 14.

* * * * *